US008401198B2

(12) United States Patent
Oh et al.

(10) Patent No.: US 8,401,198 B2
(45) Date of Patent: Mar. 19, 2013

(54) METHOD OF IMPROVING ACOUSTIC PROPERTIES IN MUSIC REPRODUCTION APPARATUS AND RECORDING MEDIUM AND MUSIC REPRODUCTION APPARATUS SUITABLE FOR THE METHOD

(75) Inventors: Jae-one Oh, Yongin-si (KR); Ho-young Sung, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 1203 days.

(21) Appl. No.: 12/181,425

(22) Filed: Jul. 29, 2008

(65) Prior Publication Data

US 2009/0122999 A1 May 14, 2009

(30) Foreign Application Priority Data

Nov. 13, 2007 (KR) .................. 10-2007-0115502

(51) Int. Cl.
*H04R 29/00* (2006.01)
(52) U.S. Cl. ............... 381/58; 381/61; 381/74; 381/309
(58) Field of Classification Search .................. None
See application file for complete search history.

(56) References Cited

U.S. PATENT DOCUMENTS

| 2002/0006206 A1* | 1/2002 | Scofield | 381/27 |
| 2006/0045294 A1* | 3/2006 | Smyth | 381/309 |
| 2007/0025560 A1* | 2/2007 | Asada | 381/61 |
| 2007/0110129 A1 | 5/2007 | Asada | |

FOREIGN PATENT DOCUMENTS

| JP | 1989-240099 | 9/1989 |
| KR | 2000-46900 | 7/2000 |
| KR | 1020000046900 | 7/2000 |
| KR | 1020050091192 | 9/2005 |
| KR | 1020070046724 | 5/2007 |

OTHER PUBLICATIONS

Korean Non-Final Rejection dated Oct. 23, 2012 issued in KR Application No. 10-2007-0115502.

* cited by examiner

*Primary Examiner* — Benjamin Sandvik
*Assistant Examiner* — Leslie Pilar Cruz
(74) *Attorney, Agent, or Firm* — Stanzione & Kim, LLP

(57) ABSTRACT

A method of measuring and improving acoustic properties, and a recording medium and a music reproduction apparatus that are suitable for the method. The method includes reproducing and outputting an analysis signal stored in codec file types, recording the output analysis signal in the codec file types, obtaining an impulse response by performing convolution on the recorded signal and an inverse signal of the analysis signal, and correcting frequency properties based on the impulse response. By storing a signal that is supposed to be generated by a signal generation device in codec file types, it is possible to implement the signal in a music reproduction apparatus without a need for the signal generation device. By correcting frequency property, the music reproduction apparatus can improve the performance of an output acoustic signal close to that of an original sound.

27 Claims, 7 Drawing Sheets

METHOD OF IMPROVING ACOUSTIC PROPERTIES IN MUSIC REPRODUCTION APPARATUS AND RECORDING MEDIUM AND MUSIC REPRODUCTION APPARATUS SUITABLE FOR THE METHOD

CROSS-REFERENCE TO RELATED APPLICATIONS

This application claims the benefit of Korean Patent Application No. 10-2007-0115502, filed on Nov. 13, 2007, in the Korean Intellectual Property Office, the disclosure of which is incorporated herein in its entirety by reference.

BACKGROUND OF THE INVENTION

1. Field of the Invention

The present general inventive concept generally relates to a method of measuring and improving acoustic properties and a recording medium and a music reproduction apparatus that are suitable for the method, and more particularly, to a method of improving acoustic properties, whereby the acoustic properties can be measured by a music reproduction apparatus itself and frequency property correction can be performed based on the measured acoustic properties, and a recording medium and a music reproduction apparatus that are suitable for the method.

2. Description of the Related Art

At present, various kinds of portable small-size music reproduction apparatuses are available. For example, such music reproduction apparatuses may be a Moving Picture Experts Group (MPEG)-1 Audio Layer 3 Player (MP3P) that is capable of reproducing MP3 music files, a mobile communication terminal, and a Portable Multimedia Player (PMP) capable of reproducing moving picture files and MP3 files. Such music reproduction apparatuses usually include a speaker or a headphone output terminal, or an earphone output terminal without a speaker.

In order to measure the performance of acoustic equipment such as a speaker or an earphone, frequency response is measured using acoustic measurement equipment, such as a CLIO acoustic analysis system and a maximum length sequence spectral analysis (MLSSA) system, which are currently widely used acoustic measurement equipment. Such acoustic measurement equipment generates an input signal in real time in order to measure a response to an output signal, and performs speaker phase check, measures sound pressure level distribution, performs delay time adjustment, performs transmission frequency property adjustment, and the like.

In order to add an acoustic measurement function to a speaker or an earphone of a music reproduction apparatus, an additional device for separate measurements, such as a signal generation device, is required. However, such an additional device is not easy to apply to a small-size device and incurs additional costs.

SUMMARY OF THE INVENTION

The present general inventive concept provides a method of improving acoustic properties, whereby the performance of a speaker and an earphone connected to an output terminal is measured using a music reproduction apparatus and a basic component thereof, i.e., a music file storage device, and frequency property correction is performed on the music reproduction apparatus based on data obtained by the measurement, and a recording medium and the music reproduction apparatus that are suitable for the method.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of improving acoustic performance of a music reproduction apparatus, including reproducing and outputting an analysis signal stored in codec file types, recording the output analysis signal in the codec file types, obtaining an impulse response by performing convolution on the recorded signal and an inverse signal of the analysis signal, and correcting frequency properties based on the impulse response.

The analysis signal may be a log-chirp signal or a maximum length sequence (MLS) signal.

The correction of the frequency properties may include correcting the frequency properties by performing a fast Fourier transform (FFT) on an impulse signal obtained as the impulse response.

The correction of the frequency properties may include evaluating sound quality by performing the FFT.

The evaluation of the sound quality may include evaluating the sound quality by summing up performance scores according to preset elements of tonal balance, clarity, and bass performance.

The method may further include displaying a summation result.

The method may further include correcting the frequency properties using a filter coefficient obtained by performing the FFT if a result of the evaluation of the sound quality fails to satisfy a predetermined criterion.

The foregoing and/or other aspects and utilities of the present general inventive concept may also be achieved by providing a method of improving acoustic performance of a music reproduction apparatus, including reproducing an analysis signal stored in codec file types and outputting the reproduced analysis signal via a headphone or an earphone included in the music reproduction apparatus, recording the output analysis signal in the codec file types, applying a weight value corresponding to properties of the headphone or the earphone to the recorded signal, obtaining an impulse response by performing convolution on the weight-applied signal and an inverse signal of the analysis signal, the inverse signal being stored in the codec file types, and correcting frequency properties based on the impulse response.

The foregoing and/or other aspects and utilities of the present general inventive concept may also be achieved by providing a music reproduction apparatus including a storage unit, an output unit, a recording unit, a convolution unit, and a frequency property correction unit. The storage unit may store an analysis signal and an inverse signal of the analysis signal in codec file types. The output unit may reproduce and output the analysis signal stored in the codec file types. The recording unit may record the output analysis signal in the codec file types. The convolution unit may obtain an impulse response by performing convolution on the recorded signal and an inverse signal of the analysis signal. The frequency property correction unit may correct frequency properties based on the impulse response.

The music reproduction apparatus may simultaneously perform the reproduction and the recording.

The frequency property correction unit may include a fast Fourier transform (FFT) unit to perform the FFT on an impulse signal obtained as the impulse response.

The frequency property correction unit may further include a sound quality evaluation unit to evaluate sound quality by performing the FFT.

The sound quality evaluation unit may evaluate the sound quality by summing up performance scores according to preset elements of tonal balance, clarity, and bass performance.

The music reproduction apparatus may further include a display unit to display a summation result.

The frequency property correction unit may further include a filtering unit to correct the frequency properties using a filter coefficient obtained by performing the FFT if a result of the evaluation of the sound quality fails to satisfy a predetermined criterion.

The music reproduction apparatus may further include a weight application unit to apply a weight to the recorded signal according to properties of a headphone or an earphone, if the output unit is the headphone or the earphone.

The music reproduction apparatus may further include a graphical user interface to initiate the sound quality evaluation, and to select one or more preset sound quality states based on the sound quality evaluation.

The foregoing and/or other aspects and utilities of the present general inventive concept may also be achieved by providing a method of improving sound quality of a sound reproduction apparatus, the method comprising outputting an analysis signal stored in a source file of the sound reproduction apparatus, recording the outputted analysis signal, convoluting the recorded analysis signal and an inverse signal of the analysis signal to obtain an impulse response of the sound reproduction apparatus, and evaluating frequency information of the impulse response to adjust output properties of the sound reproduction apparatus.

The outputting an analysis signal may be performed without using a signal generation device.

The analysis signal and the inverse signal may be encoded in MP3 or WAV file format.

The evaluating frequency information operation may include generating an equalization (EQ) curve parameter to adjust frequency response properties of the sound reproduction apparatus.

The method of improving sound quality of a sound reproduction apparatus may further include individually displaying performance scores corresponding to a plurality of predetermined sound quality values, and displaying one or more preset sound quality states based on the performance scores.

The foregoing and/or other aspects and utilities of the present general inventive concept may also be achieved by providing a sound reproduction apparatus, including a storage unit to store an analysis signal in a codec sound source file, an output unit to output the analysis signal without using a signal generation unit, a recording unit to record the outputted analysis signal, a convolution unit to perform convolution on the recorded analysis signal and an inverse signal of the analysis signal to obtain an impulse response of the sound reproduction apparatus, and a frequency correction unit to evaluate frequency information of the impulse response and to adjust output properties of the sound reproduction apparatus based on the evaluation.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
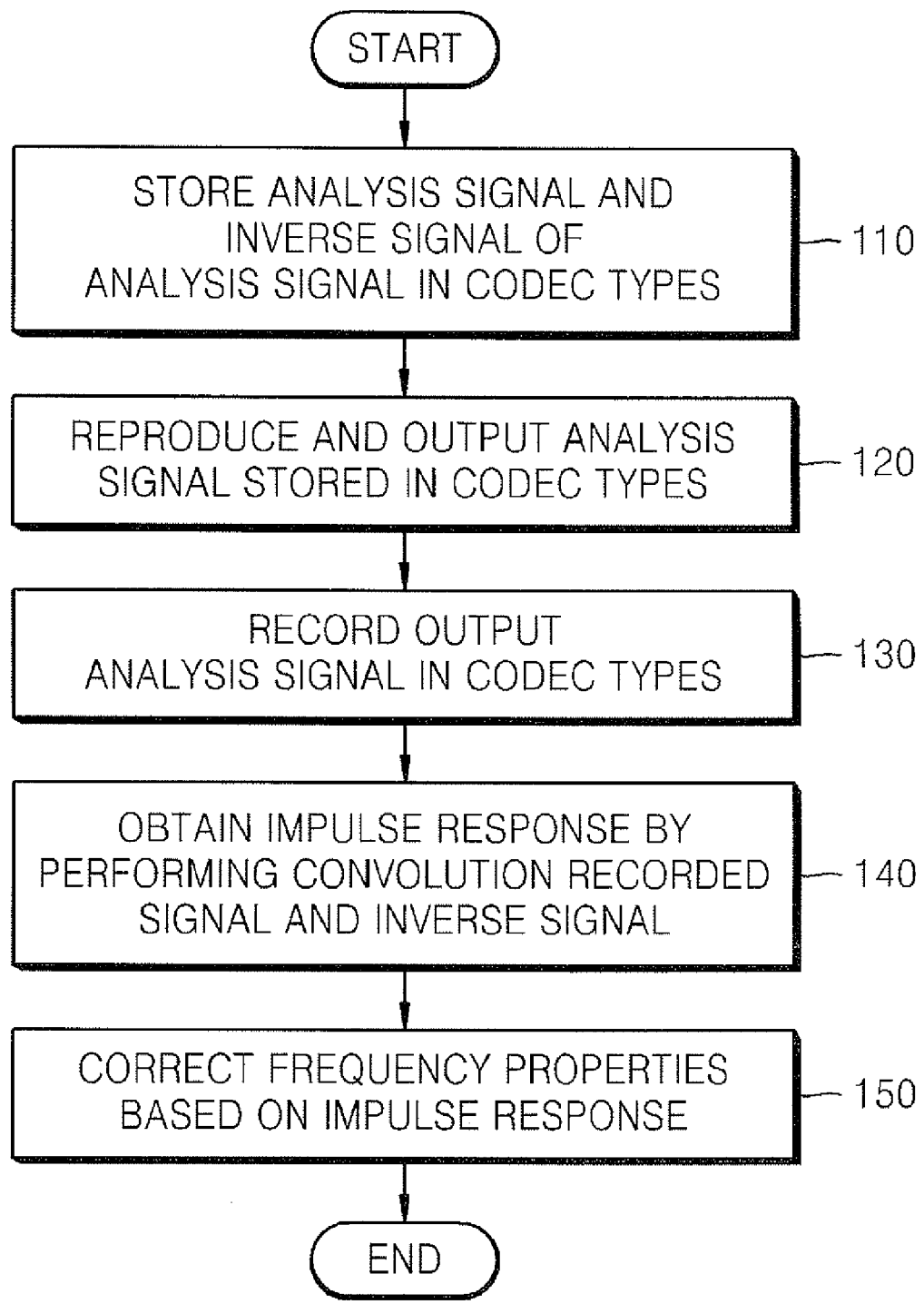
FIG. 1 is a flowchart illustrating a method of improving acoustic performance in a music reproduction apparatus, according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. In the following description of the present general inventive concept, detailed description of known functions and configurations incorporated herein will be omitted for conciseness and clarity.

FIG. 1 is a flowchart illustrating a method of improving acoustic performance in a music reproduction apparatus according to an embodiment of the present general inventive concept. Although the present general inventive concept will be described in terms of a music reproduction apparatus, the present general inventive concept is not limited thereto, and thus, the present general inventive concept may also be applied to many other types of sound reproduction apparatus, for example, video reproduction apparatus.

Referring to FIG. 1, in operation 110, an analysis signal and an inverse signal of the music reproduction apparatus can be stored in codec file types. The analysis signal can then be used to obtain a mathematically calculated impulse response of the music reproduction apparatus. The analysis signal may be a log-chirp signal or a maximum length sequence (MLS) signal. The log-chirp signal and the MLS signal are generally used as input signals for acoustic measurement equipment to measure the performance of an acoustic device. The log-chirp signal, often called a sweep sine signal, can take the form of a sine signal that slides slowly with frequency. The MLS signal can be a pseudo random sequence signal of pulses. In such case, the MLS signal does not have time information. The phase information of the MLS signal may be random and the amplitude of the MLS signal may be constant across the entire frequency domain. A reproduced MLS signal can include a frequency domain in the range of about 20 Hz-20 kHz that is an audible frequency range. In one aspect, the analysis signal and the inverse signal can be encoded in Moving Picture Experts Group (MPEG)-1 Audio Layer 3 (MP3)

and waveform (WAV) file types. However, the present general inventive concept is not limited thereto, and thus, the analysis signal and the inverse signal may also be encoded in other types as long as a music or other sound source can be encoded in file types.

In operation 120, the analysis signal stored in the codec file types can be reproduced and output.

In operation 130, the output analysis signal can then be recorded in the codec file types. The music reproduction apparatus can perform the recording operation while performing reproduction and output operations, such that the recording operation is also performed in the codec file types.

In operation 140, convolution can be performed on the recorded signal and the inverse signal of the analysis signal in order to obtain an impulse response. The inverse signal of the analysis signal generally means a signal having an inverse relationship to the analysis signal in terms of frequency over time. The inverse signal may also be stored in the codec file types. Convolution is a mathematical operation expressing a relationship between an input signal x(t) passing through a linear time-invariant system and an impulse response h(t) of the linear time-invariant system, and is generally used to obtain an output signal with respect to an input signal in the linear time-invariant system, for example, as expressed by Equation 1 below.

$$y(t)=x(t)*h(t) \quad \text{Equation (1)}$$

where x(t) indicates an input for a linear time-invariant system, y(t) indicates an output, and h(t) indicates an impulse response. In the present general inventive concept, the inverse signal corresponds to an input x(t) and the recorded signal corresponds to an output y(t). By performing integration, the impulse response h(t) can be obtained.

In operation 150, the frequency properties can be corrected based on the impulse response. To do so, a Fast Fourier Transform (FFT) can be performed on an impulse signal obtained as the impulse response. After sound quality evaluation using the FFT is performed, performance scores according to preset sound quality evaluation items can be summed up to evaluate sound quality. By changing a filter coefficient obtained by performing the FFT, the frequency properties can be corrected such that the sound quality of the recorded signal is made to be substantially similar to the sound quality of the original signal.

Figure 2:
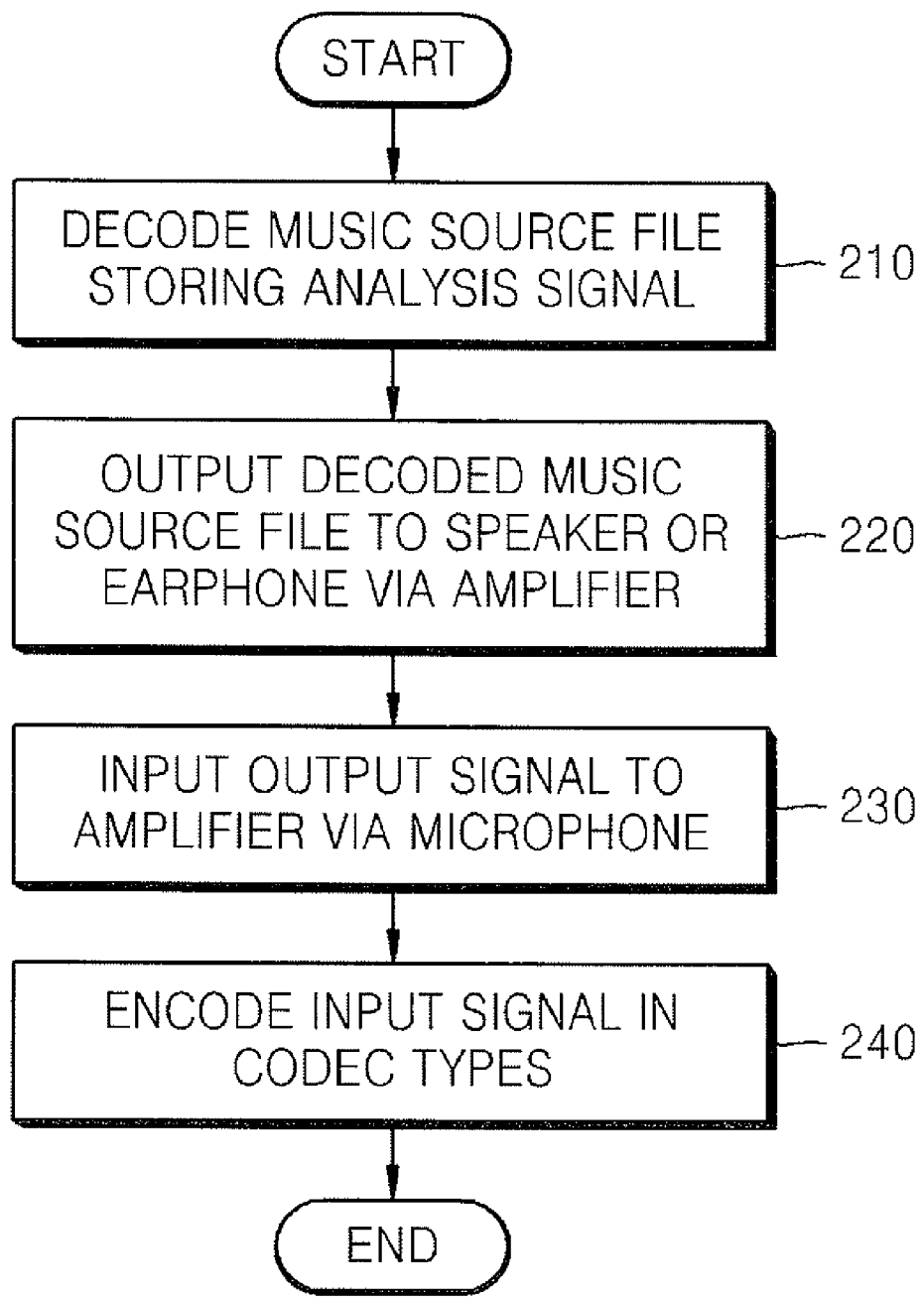
FIG. 2 is a flowchart illustrating in detail the operation of reproducing and outputting an analysis signal and the operation of recording the output analysis signal of FIG. 1, according to an embodiment of the present general inventive concept.

FIG. 2 is a flowchart illustrating in detail operations 120 and 130 of FIG. 1, according to an embodiment of the present general inventive concept.

Referring to FIG. 2, in operation 210, a music source file which stores the analysis signal can be decoded. In other words, an MP3 file or a WAV file in which the log-chirp signal or the MLS signal has been encoded can be reproduced.

In operation 220, the decoded music source file can be output to a speaker or an earphone via an amplifier.

In operation 230, the output signal can be input to the amplifier via a microphone. To perform the recording operation, if an earphone is used, a user can record the output signal by taking the earphone around to the microphone.

In operation 240, the output signal which has been input to the amplifier can be encoded in the codec file types.

Figure 3:
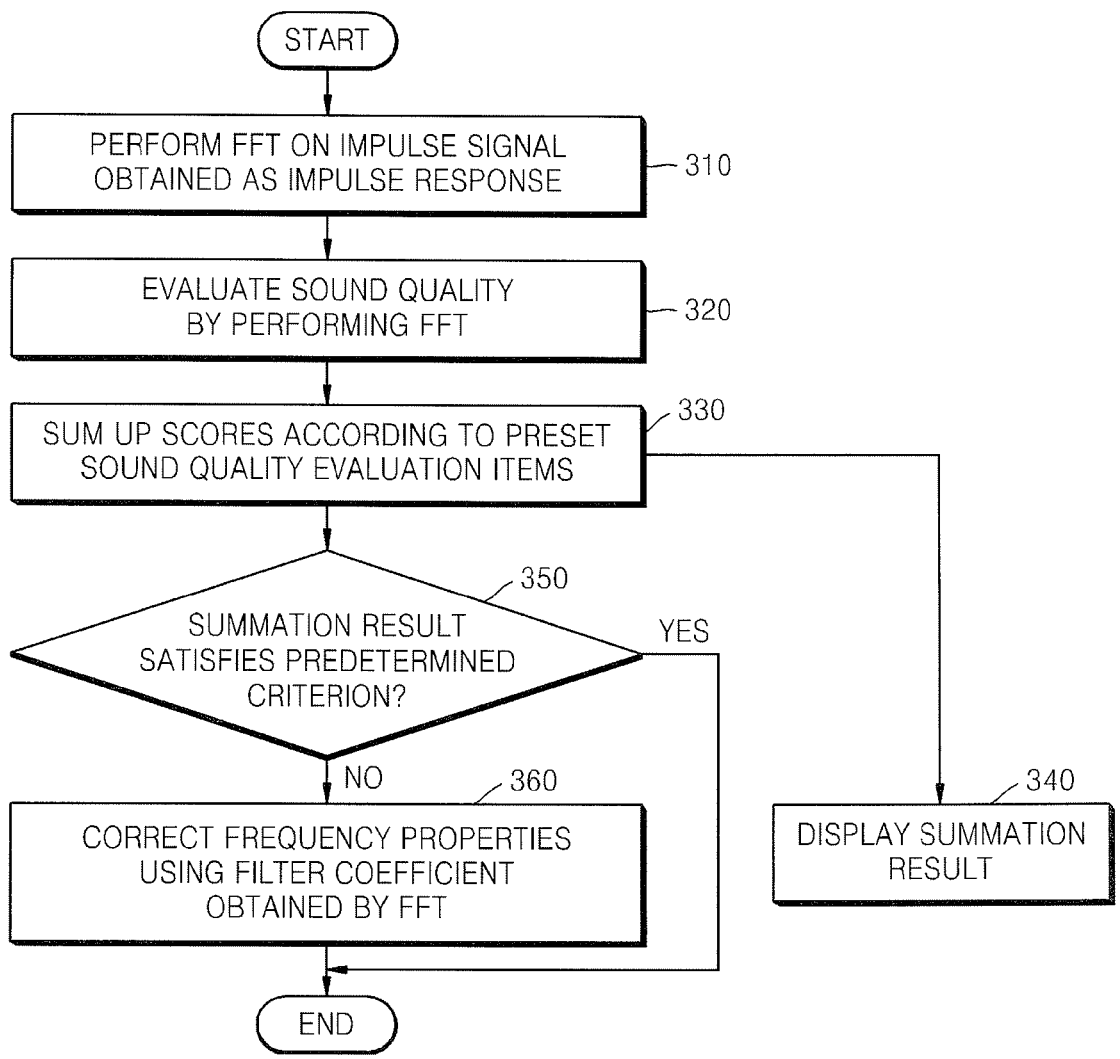
FIG. 3 is a flowchart illustrating in detail the operation of correcting frequency properties of FIG. 1, according to an embodiment of the present general inventive concept.

FIG. 3 is a flowchart illustrating in detail operation 150 of FIG. 1, according to an embodiment of the present general inventive concept.

Referring to FIG. 3, in operation 310, the FFT can be performed on the impulse signal obtained as the impulse response. The fourier transform involves transforming a signal in the time domain into a signal in the frequency domain. Thus, frequency property information of a predetermined signal can be obtained. The FFT involves fast performing the fourier transform on discrete data and is an efficient algorithm for fast performing a discrete Fourier transform (DFT) and an inverse transform thereof.

In operation 320, sound quality can be evaluated as a result of the FFT. For example, elements for sound quality evaluation may include tonal balance, clarity, bass performance, and the like. However, the present general inventive concept is not limited thereto, and thus, such elements for sound quality evaluation may also include other known elements. Tonal balance generally means a frequency band balance of music or a musical instrument, i.e., a level relationship among a low band, an intermediate band, an intermediate-high band, and a high band. Clarity can be used as a measurement to indicate the clarity of music. Generally, a clarity value is a ratio to the total energy by regarding energy up to 80 ms as a direct sound and indicates the clarity of music as an early-to-late sound ratio. Bass performance can be used as a measure indicating low-frequency performance.

In operation 330, the sound quality evaluation values can be determined, and the performance scores according thereto can be summed up. To this end, a maximum value for each of the sound quality evaluation values for sound quality that is substantially similar to that of an original sound may be experimentally obtained. Moreover, a weight may be applied to each of the sound quality evaluation values.

In operation 340, the summation result may be displayed in order to inform a user of the summation result.

In operation 350, it can be determined if the summation result satisfies a predetermined criterion. The predetermined criterion may be preset or set by the user. Here, if the summation result satisfies the predetermined criterion, frequency property correction can be terminated. Otherwise, if the summation result fails to satisfy the predetermined criterion, the method proceeds to operation 360.

In operation 360, the frequency properties can be corrected using the filter coefficient obtained by performing the FFT. By performing the FFT, an equalization (EQ) curve parameter can be obtained as the filter coefficient. By causing the EQ curve parameter to pass through a filter, the frequency properties can be corrected suitably to improve the output sound quality of the sound reproduction apparatus.

Figure 4:
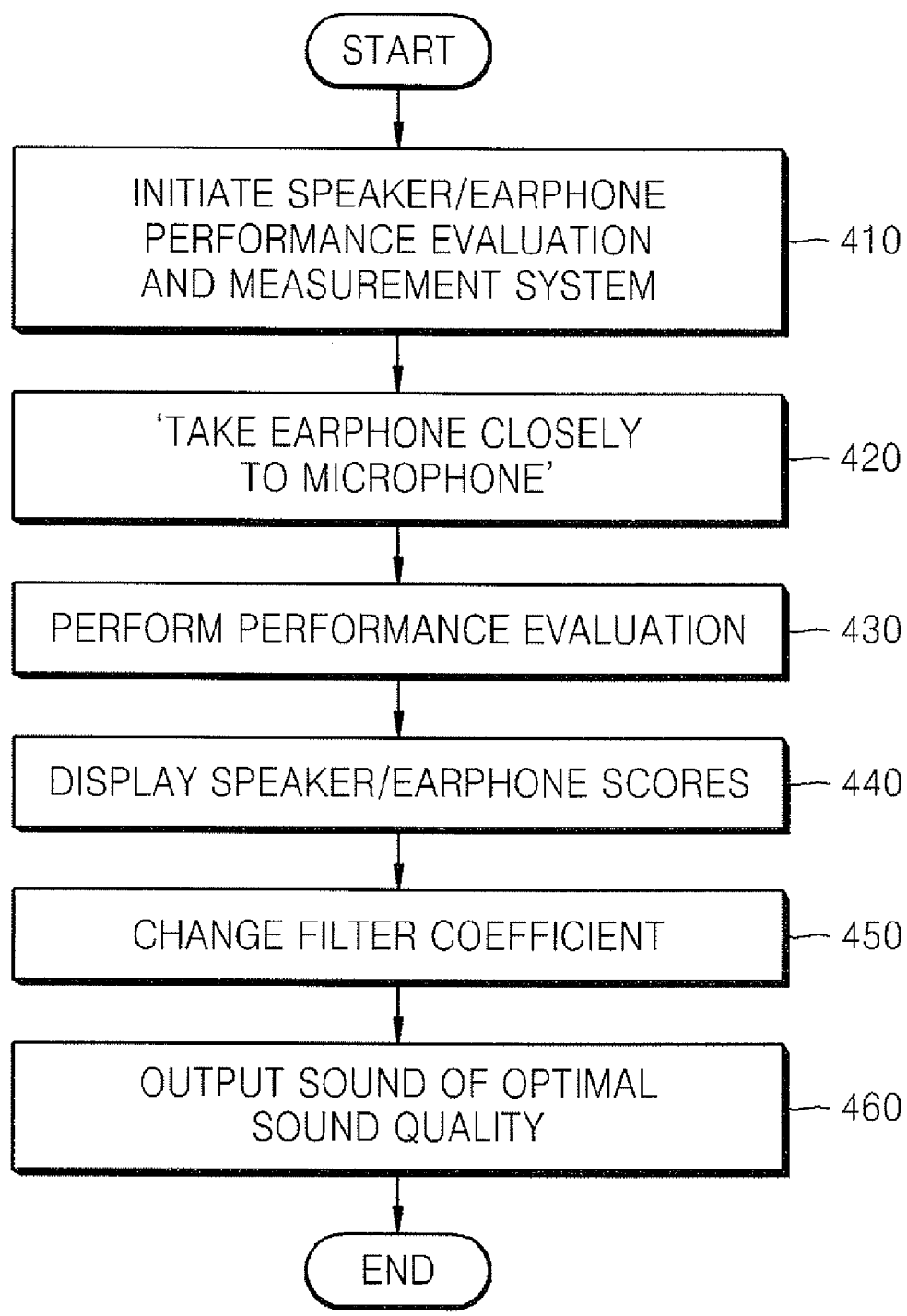
FIG. 4 is a flowchart illustrating a user interface according to the present general inventive concept.

FIG. 4 is a flowchart illustrating a user interface according to the present general inventive concept.

Referring to FIG. 4, in operation 410, if the user selects a menu to improve acoustic performance, a description called 'Initiate speaker or earphone performance evaluation and initialize measurement system' can be output.

In operation 420, if an earphone is used as the output, a description called 'Take the earphone close to the microphone' can be output. In this case, the user can take the earphone close to the microphone.

In operation 430, performance evaluation can be performed after a lapse of a predetermined time.

In operation 440, once the performance evaluation is terminated, a summation result of the performance scores according to values indicating the performance of the speaker or the earphone can be displayed. However, each of the performance scores may also be individually displayed.

In operation 450, the frequency properties can be corrected by changing the filter coefficient into a preset optimal state.

In operation 460, a sound of improved quality with corrected frequency properties can be output.

Figure 5:
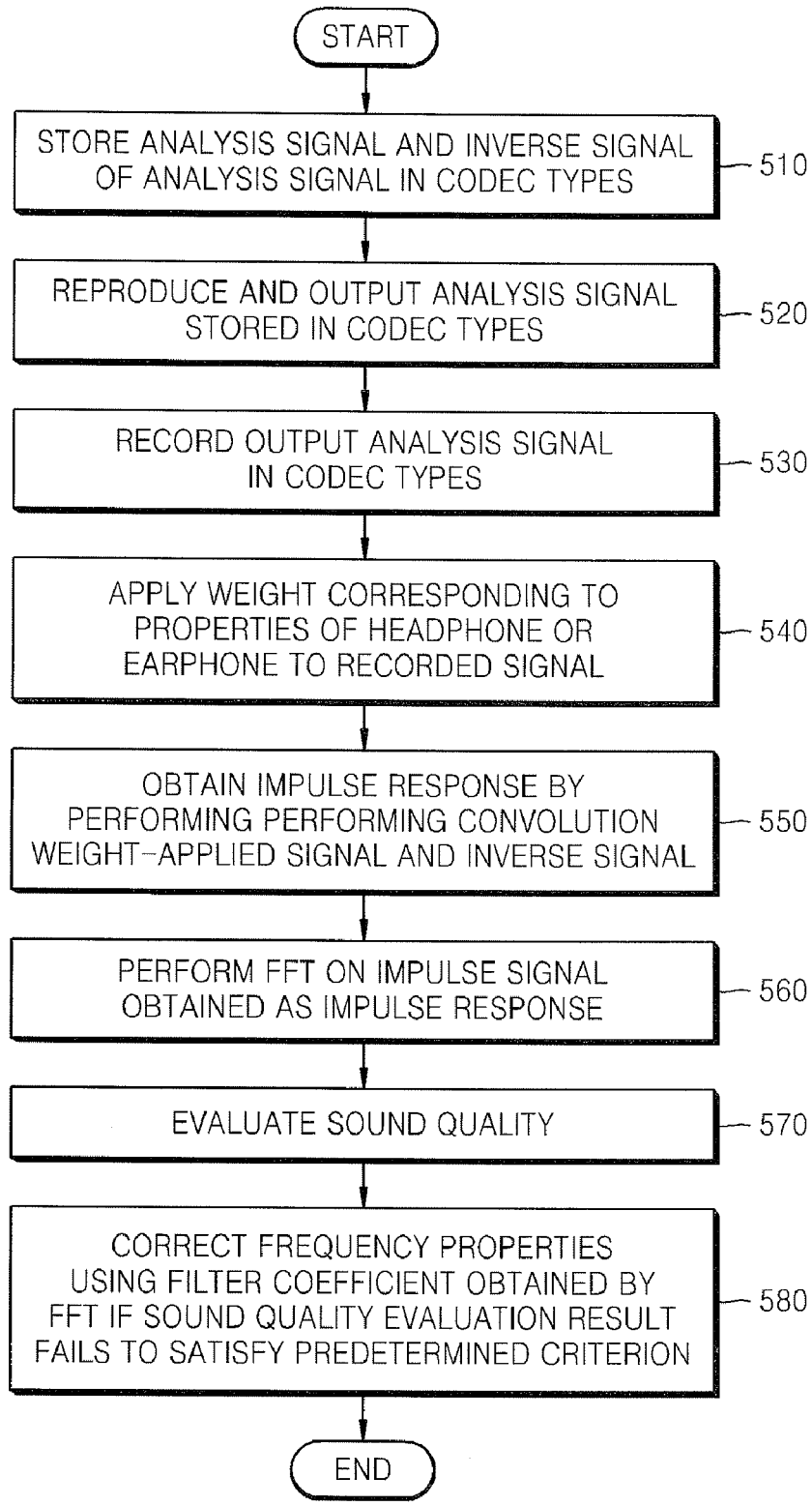
FIG. 5 is a flowchart illustrating a method of improving acoustic performance in a music reproduction apparatus, according to another embodiment of the present general inventive concept.

FIG. 5 is a flowchart illustrating a method of improving acoustic performance in a music reproduction apparatus, according to another embodiment of the present general inventive concept.

Referring to FIG. 5, the operations of the method illustrated in FIG. 5 are the same as those of the method according to the previous embodiment of the present general inventive concept, except for operations 540 and 550, and thus, those same operations of the method will not be described again in detail.

In FIG. 5, recording can be performed using a headphone or an earphone. More specifically, a sound output via the headphone or the earphone can be recorded by placing the headphone or the earphone next to a microphone.

In operation 540, a weight corresponding to the properties of the headphone or the earphone can be applied to the recorded signal. In particular, for the earphone, a dummy head can be used for a frequency response measurement for the earphone. The dummy head can be designed in the shape of a human head and can have a measurement microphone inside an auditory meatus of each ear. When the earphone is mounted properly, the auditory meatus can serve as a part of the earphone and can affect the frequency response properties. Accordingly, since the structure of the auditory meatus, including depth and diameter, can vary, the frequency response properties measured for the earphone may be different from those measured for a general speaker. Thus, in order to obtain the same frequency response properties as those corresponding to the speaker, a weight can be applied to one or more predetermined frequency bands.

Figure 6:
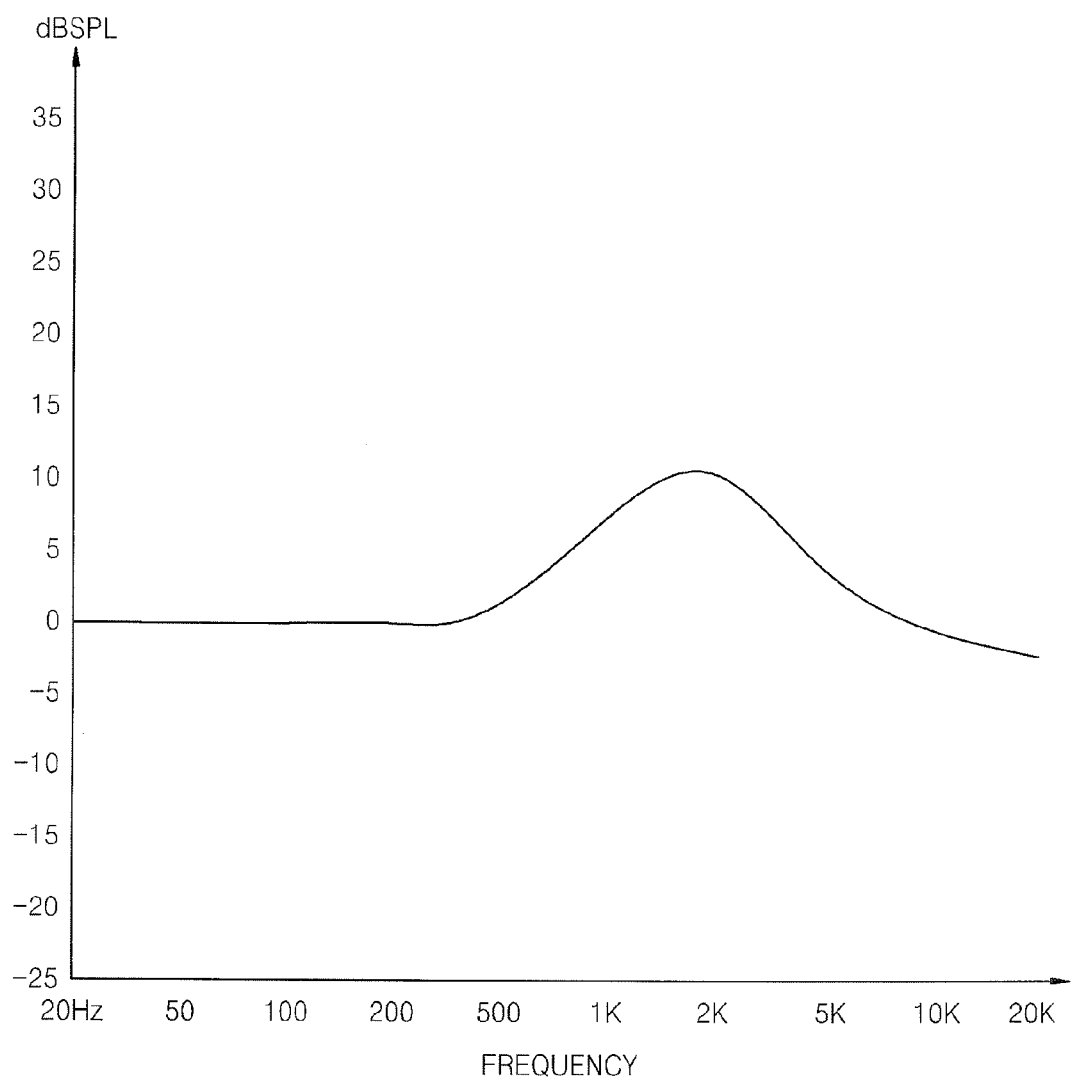
FIG. 6 is a graph illustrating a frequency response curve of an earphone to which a weight is added, according to an embodiment of the present general inventive concept.

FIG. 6 is a graph illustrating a frequency response curve of an earphone to which a weight has been applied, according to an embodiment of the present general inventive concept.

Referring to FIG. 6, the horizontal axis indicates an audible frequency band and the vertical axis indicates an output level. The units representing the vertical axis are listed in dBspl, which is a measure indicating the magnitude of force for all audible sounds that are movements caused by the pressure of molecules in the air. In the graph illustrated in FIG. 6, a weight has been applied to a frequency band in the range of about 500 Hz-5 kHz.

In operation 550, convolution can be performed on the weight-applied signal and the inverse signal in order to obtain an impulse response.

Figure 7:
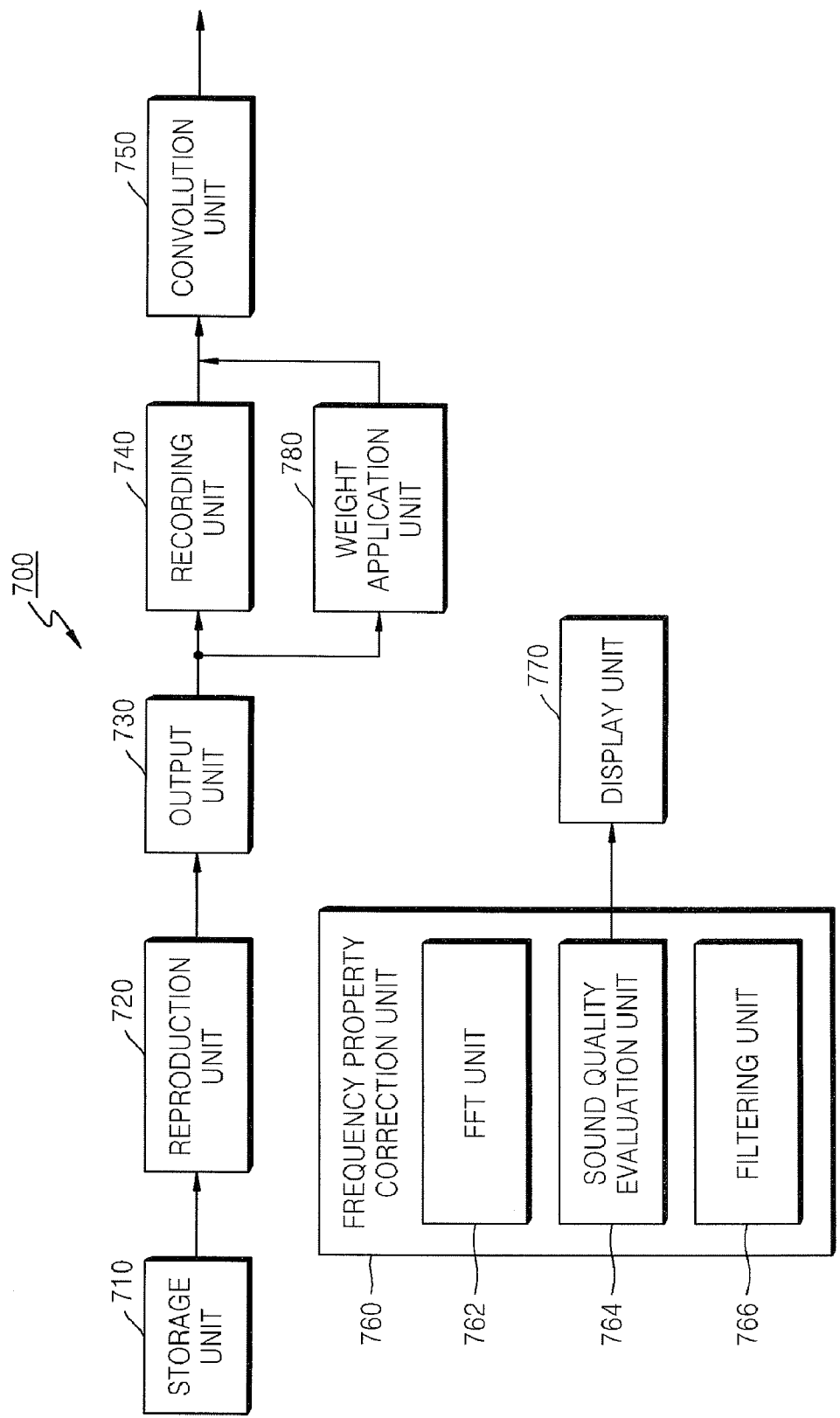
FIG. 7 is a block diagram of a music reproduction apparatus according to an embodiment of the present general inventive concept.

FIG. 7 is a block diagram of a music reproduction apparatus 700 according to an embodiment of the present general inventive concept.

Referring to FIG. 7, the music reproduction apparatus 700 may include a storage unit 710, a reproduction unit 720, an output unit 730, a recording unit 740, a convolution unit 750, a weight application unit 780, and a frequency property correction unit 760 including an FFT unit 762, a sound quality evaluation unit 764, and a filtering unit 766. The music reproduction apparatus 700 may further include a display unit 770.

The music reproduction apparatus 700 generally refers to an MP3 player, a cassette player, a Compact Disc (CD) player, a computer, or the like, although many other devices may also be used to reproduce an encoded music source file without departing from the principles and spirit of the present general inventive concept.

The storage unit 710 can store an analysis signal and an inverse signal of the storage unit 710 in codec file types such as an MP3 or WAV file type. However, the present general inventive concept is not limited thereto, and thus, the analysis signal and the inverse signal may also be stored in other file types as long as a music or other sound source can be encoded in file types. The analysis signal can be a signal to obtain an already mathematically calculated impulse response, for example, a log-chirp signal or an MLS signal.

The reproduction unit 720 can decode a music source file in which the analysis signal stored in the storage unit 710 has been encoded. In other words, an MP3 file or a WAV file in which the log-chirp signal or the MLS signal has been encoded can be reproduced.

The output unit 730 may then output a reproduced sound. In one aspect, the output unit 730 may be a speaker, a headphone, or an earphone. However, the present general inventive concept is not limited thereto, and thus, the output unit 730 may further include other known or later developed components to output sound, and may include any other form or type of output means capable of outputting a sound.

The recording unit 740 may input the output signal of the output unit 730 to an amplifier via a microphone, and may encode an input signal to the amplifier in the codec file types. If an earphone is used, the user can record by directly placing the earphone around to the microphone. In another embodiment of the present general inventive concept, the reproduction and the recording operations, i.e., encoding and decoding, can be performed at the same time.

The convolution unit 750 can obtain an impulse response by performing convolution on the recorded signal and the inverse signal of the analysis signal. As discussed above with respect to equation 1, convolution is a mathematical operation expressing a relationship between an input signal x(t) passing through a linear time-invariant system, and an impulse response h(t) of the linear time-invariant system, and is generally performed to obtain an output signal with respect to an input signal in the linear time-invariant system.

If the output unit 730 is a headphone or an earphone, a weight application unit 780 can apply a weight to the recorded signal, corresponding to properties of the headphone or the earphone. In particular, in the case of an earphone, when the earphone is mounted in the ears of the user, an auditory meatus of the ears may serve as a part of the earphone, and may affect the frequency response properties. Accordingly, since the structure of the auditory meatus, including depth and diameter, can vary, the frequency response properties measured for the earphone may be different from those measured for a general speaker. Moreover, in the case of an earphone, a weight can be applied to one or more predetermined frequency bands in order to obtain substantially the same frequency response properties as those corresponding to the speaker. In this case, the convolution unit 750 can obtain an impulse response by performing convolution on the weight-applied signal and the inverse signal.

The frequency property correction unit 760 can correct frequency properties based on the impulse response. To this end, the FFT unit 762 may perform an FFT on an impulse signal obtained as the impulse response. Then, after sound quality evaluation by the FFT, performance scores according to preset sound quality evaluation values can be summed up. By changing a filter coefficient obtained by performing the FFT, the frequency properties can be corrected such that the sound quality is substantially similar to the original sound quality.

The sound quality evaluation unit 764 can evaluate sound quality as a result of the FFT. For example, the elements for sound quality evaluation may include tonal balance, clarity, bass performance, and the like. However, the present general inventive concept is not limited thereto, and thus, the elements for sound quality evaluation may also include other known elements without being limited to the above-described examples. The performance scores obtained by the evaluation of the elements can then be summed up. To this end, a maximum value for each of the sound quality evaluation values for best sound quality that is closest to that of an original sound may be experimentally obtained. Moreover, a weight may be applied to each of the sound quality evaluation values. The summation result may be displayed on the display unit 770 in order to inform a user of the summation result.

The filtering unit 766 can correct frequency properties using a filter coefficient obtained by performing the FFT if the summation result fails to satisfy a predetermined criterion. By performing the FFT, a filter coefficient called 'EQ curve parameter' can be obtained. By causing the filter coefficient to pass through the filtering unit 766, frequency properties can be suitably corrected for sound quality that is substantially similar to that of an original sound.

As described above, according to the present general inventive concept, by storing a signal that is supposed to be generated by a signal generation device in codec file types, it is possible to implement the signal in a small-size music reproduction apparatus without a need for the signal generation device, thus reducing costs. Moreover, the music reproduction apparatus itself measures an acoustic signal, displays the performance of an output means as a performance score, evaluates the score, and corrects frequency properties based on the result, thereby improving the performance of an output acoustic signal to make the sound quality substantially similar to that of an original sound.

The method of improving acoustic performance in a music reproduction apparatus according to the embodiments of the present general inventive concept can also be embodied as a computer-readable code on a computer-readable medium. The computer-readable medium can include a computer-readable recording medium and a computer-readable transmission medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of improving acoustic performance of a music reproduction apparatus, the method comprising:
   reproducing and outputting an analysis signal stored in a codec file;
   recording the output analysis signal in the codec file;
   obtaining an impulse response by performing convolution on the recorded signal and an inverse signal of the analysis signal; and
   correcting frequency properties based on the impulse response.

2. The method of claim 1, wherein the analysis signal is a log-chirp signal or a maximum length sequence (MLS) signal.

3. The method of claim 1, wherein the correction of the frequency properties comprises correcting the frequency properties by performing a fast Fourier transform (FFT) on an impulse signal obtained as the impulse response.

4. The method of claim 3, wherein the correction of the frequency properties comprises evaluating sound quality by performing the FFT.

5. The method of claim 4, wherein the evaluation of the sound quality comprises evaluating the sound quality by summing up performance scores according to preset elements of tonal balance, clarity, and bass performance.

6. The method of claim 5, further comprising:
   displaying a summation result.

7. The method of claim 4, further comprising:
   correcting the frequency properties using a filter coefficient obtained by performing the FFT if a result of the evaluation of the sound quality fails to satisfy a predetermined criterion.

8. A computer-readable recording medium having recorded thereon a program to execute the method of claim 1.

9. A method of improving acoustic performance of a music reproduction apparatus, the method comprising:
   reproducing an analysis signal stored in a codec file and outputting the reproduced analysis signal via a headphone or an earphone included in the music reproduction apparatus;
   recording the output analysis signal in the codec file;
   applying a weight value, corresponding to properties of the headphone or the earphone, to the recorded signal;
   obtaining an impulse response by performing convolution on the weight-applied signal and an inverse signal of the analysis signal, the inverse signal being stored in the codec file; and
   correcting frequency properties based on the impulse response.

10. The method of claim 9, wherein the analysis signal is a log-chirp signal or a maximum length sequence (MLS) signal.

11. The method of claim 9, wherein the correction of the frequency properties comprises:
   performing a fast Fourier transform (FFT) on an impulse signal obtained as the impulse response;
   evaluating sound quality by performing the FFT; and
   correcting the frequency properties using a filter coefficient obtained by performing the FFT if a result of the evaluation of the sound quality fails to satisfy a predetermined criterion.

12. A method of improving sound quality of a sound reproduction apparatus, the method comprising:
   outputting an analysis signal stored in a source file of the sound reproduction apparatus;
   recording the outputted analysis signal;
   convoluting the recorded analysis signal and an inverse signal of the analysis signal to obtain an impulse response of the sound reproduction apparatus; and
   evaluating frequency information of the impulse response to adjust output properties of the sound reproduction apparatus.

13. The method of claim 12, wherein the outputting an analysis signal is performed without using a signal generation device.

14. The method of claim 12, wherein the analysis signal and the inverse signal are encoded in MP3 or WAV file format.

15. The method of claim 12, wherein the evaluating frequency information operation comprises generating an equalization (EQ) curve parameter to adjust frequency response properties of the sound reproduction apparatus.

16. The method of claim 12, further comprising:
individually displaying performance scores corresponding to a plurality of predetermined sound quality values; and
displaying one or more preset sound quality states based on the performance scores.

17. A sound reproduction apparatus, comprising:
a storage unit to store an analysis signal in a codec sound source file;
an output unit to output the analysis signal without using a signal generation unit;
a recording unit to record the outputted analysis signal;
a convolution unit to perform convolution on the recorded analysis signal and an inverse signal of the analysis signal to obtain an impulse response of the sound reproduction apparatus; and
a frequency correction unit to evaluate frequency information of the impulse response and to adjust output properties of the sound reproduction apparatus based on the evaluation.

18. A music reproduction apparatus comprising:
a storage unit to store an analysis signal and an inverse signal of the analysis signal in a codec file;
an output unit to reproduce and output the analysis signal stored in the codec file;
a recording unit to record the output analysis signal in the codec file;
a convolution unit to obtain an impulse response by performing convolution on the recorded signal and an inverse signal of the analysis signal; and
a frequency property correction unit to correct frequency properties based on the impulse response.

19. The music reproduction apparatus of claim 18, wherein the analysis signal is a log-chirp signal or a maximum length sequence (MLS) signal.

20. The music reproduction apparatus of claim 18, wherein the music reproduction apparatus simultaneously performs the reproduction and the recording.

21. The music reproduction apparatus of claim 18, further comprising:
a weight application unit to apply a weight to the recorded signal according to properties of a headphone or an earphone, if the output unit is the headphone or the earphone.

22. The music reproduction apparatus of claim 18, wherein the frequency property correction unit comprises a fast Fourier transform (FFT) unit to perform the FFT on an impulse signal obtained as the impulse response.

23. The music reproduction apparatus of claim 22, wherein the frequency property correction unit further comprises a filtering unit to correct the frequency properties using a filter coefficient obtained by performing the FFT if a result of the evaluation of the sound quality fails to satisfy a predetermined criterion.

24. The music reproduction apparatus of claim 22, wherein the frequency property correction unit further comprises a sound quality evaluation unit to evaluate sound quality by performing the FFT.

25. The music reproduction apparatus of claim 24, wherein the sound quality evaluation unit evaluates the sound quality by summing up performance scores according to preset elements of tonal balance, clarity, and bass performance.

26. The music reproduction apparatus of claim 23, further comprising:
a display unit to display a summation result.

27. The music reproduction apparatus of claim 24, further comprising:
a graphical user interface to initiate the sound quality evaluation, and to select one or more preset sound quality states based on the sound quality evaluation.

* * * * *